United States Patent [19]
Felter et al.

[11] Patent Number: 5,989,776
[45] Date of Patent: Nov. 23, 1999

[54] PHOTORESIST COMPOSITION FOR EXTREME ULTRAVIOLET LITHOGRAPHY

[75] Inventors: T. E. Felter; G. D. Kubiak, both of Alameda County, Calif.

[73] Assignee: Sandia Corporation, Livermore, Calif.

[21] Appl. No.: 09/158,948

[22] Filed: Sep. 21, 1998

Related U.S. Application Data

[62] Division of application No. 08/877,031, Jun. 17, 1997, which is a continuation of application No. 08/532,958, Sep. 21, 1995, abandoned.

[51] Int. Cl.$^6$ .................................................. G03C 1/492
[52] U.S. Cl. .......................................................... 430/270.1
[58] Field of Search .......................................... 430/270.1

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,789,471 | 2/1974 | Spindt et al. | 29/25.17 |
| 3,812,559 | 5/1974 | Spindt et al. | 29/25.18 |
| 4,515,886 | 5/1985 | Yamacka et al. | 430/270 |
| 4,588,801 | 5/1986 | Harrah et al. | 528/33 |
| 5,003,567 | 3/1991 | Hawryluk et al. | 378/34 |
| 5,039,593 | 8/1991 | Zeigler et al. | 430/313 |
| 5,064,396 | 11/1991 | Spindt | 445/50 |
| 5,291,339 | 3/1994 | Mochimaru et al. | 359/43 |
| 5,380,621 | 1/1995 | Dichiara et al. | 430/272 |
| 5,401,614 | 3/1995 | Dichiara et al. | 430/323 |
| 5,482,317 | 1/1996 | Dichiara et al. | 430/271.1 |
| 5,554,485 | 9/1996 | Dichiara et al. | 430/270 |

OTHER PUBLICATIONS

CAPLUS abstract, Scheckler et al. J. Vac. Sci. Technol., B (1994) 12(4), 2361–2371.
CAPLUS abstract, Kubiak, Proc. SPIE–Int. Opt. Eng. (1991) 1343, 283–291.

*Primary Examiner*—Janet Baxter
*Assistant Examiner*—Rosemary Ashton
*Attorney, Agent, or Firm*—Timothy Evans; Kurt Olsen

[57] ABSTRACT

A method of producing a patterned array of features, in particular, gate apertures, in the size range 0.4–0.05 μm using projection lithography and extreme ultraviolet (EUV) radiation. A high energy laser beam is used to vaporize a target material in order to produce a plasma which in turn, produces extreme ultraviolet radiation of a characteristic wavelength of about 13 nm for lithographic applications. The radiation is transmitted by a series of reflective mirrors to a mask which bears the pattern to be printed. The demagnified focused mask pattern is, in turn, transmitted by means of appropriate optics and in a single exposure, to a substrate coated with photoresists designed to be transparent to EUV radiation and also satisfy conventional processing methods.

A photoresist composition for extreme ultraviolet radiation of boron carbide polymers, hydrochlorocarbons and mixtures thereof.

1 Claim, 3 Drawing Sheets

PHOTORESIST COMPOSITION FOR EXTREME ULTRAVIOLET LITHOGRAPHY

The following application is a division of U.S. patent application Ser. No. 08/877,031, filed Jun. 17, 1997 which is itself a continuation of U.S. patent application Ser. No. 08/532,958, filed Sep. 21, 1995 and now abandoned, also entitled A METHOD FOR EXTREME ULTRAVIOLET LITHOGRAPHY, from which priority is claimed.

STATEMENT OF GOVERNMENT INTEREST

This invention was made with Government support under contract no. DE-AC04-94AL8500 awarded by the U. S. Department of Energy to Sandia Corporation. The Government has certain rights in the invention.

BACKGROUND OF THE INVENTION

This invention pertains generally to microelectronic processing and more particularly to the use of projection lithography employing extreme ultraviolet light for patterning features.

At the present time semiconductor electronics are produced by projection lithographic methods whereby a circuit pattern or blueprint is transferred from a mask onto a silicon wafer. The process is similar to exposing a film negative onto photographic paper except that the transferred image is reduced rather than enlarged thereby making the electronic component smaller. The demand for smaller critical dimensions in advanced computer chips is continuing to spur improvements in projection lithography. Presently, deep ultraviolet lithography systems, operating at 248 nm and producing 0.25 $\mu$m features, are now commercially available and 193 nm lithography systems, capable of producing features in the 0.18 $\mu$m range, are under development. In order to produce smaller features it is necessary to operate at even shorter wavelengths. By utilizing extreme ultraviolet (EUV) radiation in the range of 4.5–15 nm it is possible to produce features smaller than 0.18 $\mu$m. The resolution and therefore, the minimum feature size that can be obtained with EUV is a factor of 2–6 times better than with the present deep-UV or 193 nm lithography. However, as will be discussed below, other features of the projection lithography process have impeded the use of shorter wavelengths.

Photoresists are photosensitive films used in projection lithography for transfer of images to a substrate. They form negative or positive images. After coating a substrate with a photoresist the coated substrate is exposed to a source of activating radiation. This radiation exposure causes a chemical transformation in the exposed areas of the coated surface. After the radiation exposure step, the photoresist-coated substrate is treated with a developer solution to dissolve or otherwise remove either the radiation-exposed or unexposed areas of the coated substrate, depending upon the type of photoresist used. Unfortunately, most photoresist materials absorb extreme ultraviolet (EUV) radiation strongly in the range of 4.5–15 nm. While this is advantageous from the standpoint of resist speed (i.e. the exposure dose required to form a pattern) and the associated printing rate, it poses a serious problem for projection lithographic methods that employ EUV radiation because of highly nonuniform absorption of this radiation through the photoresist thickness. In present photoresist materials, EUV radiation will not penetrate much beyond a film thickness of 0.15 or 0.20 $\mu$m. Yet, to fabricate holes and other structures in semiconductor materials such as silicon, as well as metals, or dielectrics, the photoresist layer must be thick enough, preferably 0.5–1.0 $\mu$m, to withstand etching and other processing steps. Accordingly, in order to make use of the increased resolution afforded by the use of EUV radiation in the processing and fabrication of small structures, photoresist schemes need to be employed that can be used in conjunction with high resolution EUV radiation and yet are compatible with conventional lithographic processing methods.

As set forth above, the ability to produce smaller dimensions in electronic devices offers significant advantages. Of particular interest is the ability to fabricate gates useful for field emitter applications. The basic technology, projection lithography, useful for fabricating field-imaging and electron-emitting structures has been described by Spindt in U.S. Pat. Nos. 3,812,559; 3,665,241; 3,755,704; 3,789,471 and 5,064,396. Smaller gates allow these devices to operate efficiently at significantly lower voltages. By operating at lower voltages inexpensive drive electronics can be used. With a gate size of 0.4 $\mu$m, it is possible to employ CMOS circuitry rather than the more expensive bipolar circuits required for 1 $\mu$m gates fabricated conventionally. Lower voltages also permit lower power operation and, therefore greater efficiency. Smaller gates permit higher tip packing density and a corresponding reduction in the current required from an average tip, thereby improving the lifetime of the tips. These desirable smaller features cannot be produced by present semiconductor fabrication technology. Consequently, having the ability to fabricate a patterned array of gates with an aperture size of 0.4 $\mu$m or smaller is desirable. These same advantages pertain to semiconductor and other electronic devices.

SUMMARY OF THE INVENTION

The invention described herein employs EUV radiation in the range of about 4.5 to 15 nm for performing projection lithography in order to produce patterns and features, in particular, apertures, in the size range of about 0.4–0.05 $\mu$m. The present invention overcomes difficulties encountered in using conventional photoresists with short wavelength radiation by providing photoresists designed to accommodate EUV radiation and at the same time satisfy conventional lithographic processing requirements. This invention further improves over existing short wavelength projection lithography technology by the use of an imaging camera which permits all of the desired structures or features (holes, tubes, channels, pedestals, etc.) to be printed during a single exposure allowing for greatly increased patterning rates compared with techniques such as electron beam and ion beam lithography methods in which printing of repetitive features requires time consuming multiple exposures.

In EUV lithography (EUVL) a high energy laser beam is used to vaporize a target material to produce a plasma which in turn, produces radiation of a characteristic wavelength. The composition of the target material generally determines the wavelength of the radiation produced. For 13 nm radiation, gold is the preferred target material although other target materials such as copper, tantalum, tungsten and tin may be used. Alternatively, a synchrotron radiation source could be employed as the EUV source. The radiation is transmitted by a series of reflective mirrors to a mask.

In conventional lithography, masks are comprised of optically dense regions in which light is absorbed and less dense regions through which light is transmitted, thereby defining the pattern to be printed. However, EUV radiation is strongly absorbed by most mask materials therefore, in EUVL a reflective mask is necessary. The mask comprises a highly reflective periodic multi-layer substrate and a non-reflective absorber pattern that bears the pattern to be printed. The radiation reflected from this pattern mask enters an all-reflective camera which forms a focused image of the mask demagnified (reduced) by a factor of typically between 4 and 10, and allows for image formation over a large exposure field. The imaging camera employed in EUVL is a Schwarzschild camera such as that described in U.S. Pat. No. 5,291,339, incorporated herein by reference, although other methods of forming demagnified images, known to those skilled in the art, may be used.

The mask pattern is, in turn, transmitted by means of appropriate optics to the substrate where it is to be printed. The substrate is coated with either a positive-working or negative-working resist comprising materials which are transparent to the EUV radiation. The soluble portion of the photoresist is then removed by an appropriate solvent. A system capable of projecting a magnified or demagnified image of an existing pattern from a mask onto a photoresist coated substrate is described in U.S. Pat. No. 5,003,567, incorporated herein by reference.

In the present invention two resist schemes are employed in order to accommodate short wavelength EUV radiation and also to satisfy normal processing step requirements. In the first embodiment, a single layer resist scheme is employed in which resists whose composition makes them more transparent to 13 nm radiation than traditional resists are utilized. In the second and preferred embodiment, a bi-layer resist scheme provides for a planarizing layer covered with a thin etch resistant imaging layer. For EUVL applications bilayer resists offer increased resolution and sensitivity over the more traditional single layer resists, even those especially tailored to be transparent to 13 nm radiation. This is because in single layer resists resolution and linewidth control become difficult due to standing wave effects in the film over topography of a different refractive index. In bi-layer resists, imaging takes place only in the thin radiation sensitive imaging layer and this pattern is then transferred, by means of a plasma etching step, to an underlying planarizing layer.

Accordingly, it is an object of this invention to provide a method for fabricating submicron features on a substrate. It is a further object of this invention to provide a method for fabricating a patterned array of submicron apertures and other structures on semiconducting materials such as silicon, as well as metals and dielectrics. It is another object to provide a method for fabricating submicron features on a substrate wherein the printing rate is increased by employing a patterned array and a single exposure. Yet another object is to provide an improved photosensitive material such as a resist with an enhanced transparency to 13 nm radiation.

BRIEF DESCRIPTION OF THE DRAWINGS

The accompanying drawings, which are incorporated in and form a part of this specification, illustrate embodiments of the invention and, together with the detailed description, serve to explain the principles of the invention in which.

DETAILED DESCRIPTION OF THE INVENTION

The present invention now will be described more fully hereinafter with reference to the accompanying drawings in which the preferred embodiments of the invention are shown. This invention may, however, be embodied in many different forms and should not be construed as limited to the embodiment set forth herein.

Figure 1:
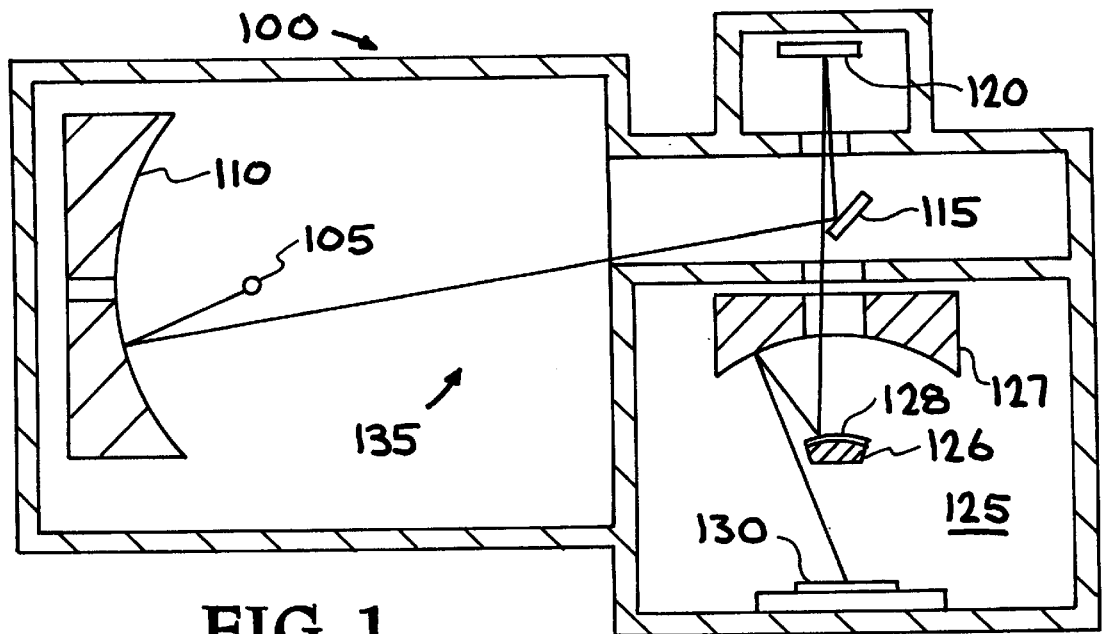
FIG. 1 is a schematic of an extreme ultraviolet light imaging system according to one preferred embodiment of the present invention.

Referring now to FIG. 1, an extreme ultraviolet light lithography (EUVL) system 100 for patterning features according to the present invention is shown. The EUVL system 100 comprises a laser produced plasma source 105, a condenser 110 and a turning mirror 115 which together form an illumination system 135, a translating reflective object mask 120, a Schwarzschild camera 125, a photoresist coated wafer 130 and the associated vacuum apparatus (not shown).

A plasma is produced when a target, 105, irradiated by a high energy laser such as an excimer laser and preferably a pulsed Nd:YAG laser operating at 1.06 nm and having greater than 120 watts of power, is vaporized. The target 105 can be a liquid or a solid metal, preferably gold, however, other materials such as copper, tantalum, tungsten, and tin can also be used. Tungsten targets have been found to be somewhat brighter near 13.4 nm than copper targets and tend to emit less debris than either copper and gold, but tungsten targets are difficult to operate reliably over the extended periods due to brittle fracture and flaking characteristics. Pellets comprised of frozen gas, such as Xe, or a Van der Waals gas cluster comprising such UV radiators as $H_2O$, $CF_4$, HCl, $O_2$, Ar, Kr and Xe also make desirable target materials Those skilled in the art will recognize that other radiation sources may be utilized to produce the extreme ultraviolet light having a wavelength between 4 nm and 15 nm. Accordingly, while in the preferred embodiment the EUV radiation is generated by a laser plasma, electric discharge or a synchrotron radiation storage ring can also be utilized.

In operation, the EUV rays, generated by target 105, are collected by the condenser 110 and reflected down the length of a vacuum structure (not shown) to the turning mirror 115. The turning mirror 115 is aligned to reflect the EUV rays and provide a 5 mm Kohler-illuminated spot on the reflective mask 120 for reflection into the Schwarzschild camera 125 as described below.

The reflective mask 120 comprises absorptive regions and reflective regions whereby a patterned image is reflected to Schwarzchild camera 125. In one preferred embodiment, the reflective mask 120 can be a molybdenum and silicon multi-layer coated fused silica flat patterned with a bi-layer absorber having 60 nm of hard baked resist and 30 nm of germanium.

All of the reflective mirror surfaces needed to reflect the extreme ultraviolet rays are coated with precisely-matched multilayer Bragg reflective coatings comprising periodic alternating layers of molybdenum and silicon or molybdenum and beryllium having bilayer periods equal to approximately half of the reflected wavelength at normal incidence. Moreover, these multilayer mirrors can be deposited on the imaging system elements with graded multilayer periods to maintain the wavelength of peak reflectance as the angle of incidence changes across the figure of each element of the imaging system.

Figure 2A:
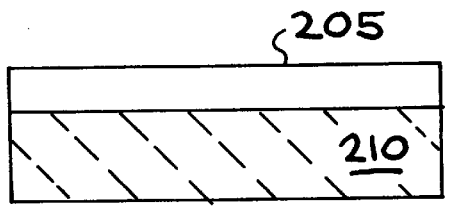
FIG. 2 is a process flow for developing a demagnified image in a resist according to one embodiment of the present invention.
Figure 2B:
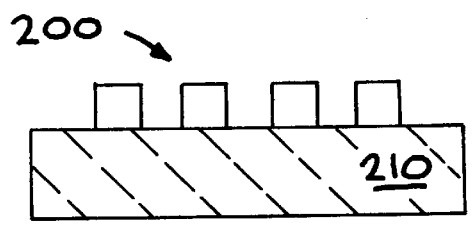

Referring now to FIG. 2, a single layer photoresist 200, which is at least partially transparent to EUV, is shown. Photoresist materials such as organosilicon polymers, boron carbide polymers, pure hydrocarbon polymers (containing little or no oxygen, which is strongly attenuating for short wavelength radiation) and/or hydrochlorocarbons, can be used individually or in combination. In this embodiment, the photoresist layer 205 is deposited by spinning or evaporation over a silicon or other flat substrate 210. For the purposes of this invention, the photoresist can contain 50–80 atomic percent carbon and 15–30 atomic percent chlorine and 20–50 atomic percent boron or other elements, such as beryllium, making it more transparent to EUV radiation than traditional organic photoresists. Increasing the atomic percentage of silicon in the photoresist improves its performance. In one embodiment the photoresist comprises an organosilicon polymer, poly(cyclohexylmethyl-co-trimethylsilylmethyl silane), in which the weight percentage of silicon is 35%. Alternatively, or in combination with such embodiment, the photoresist layer thickness can be made thin enough to yield adequate film penetration by the EUV radiation. Typically, a thickness of 110 nm of the etch-resistant co-polymer of chloromethacrylate and methylstyrene such as ZEP 520 (commercially available from Nippon Zeon) is adequate. The etch resistance of this thinner layer must then be large enough to compensate for its reduced thickness. In operation, the photoresist 205 is exposed to the extreme ultraviolet image of the mask pattern as projected by the imaging system mirrors located in the Schwarzchild camera. The pattern formed in the resist by this projected image can be revealed by developing the photoresist layer with a solvent or solution which dissolves away the exposed photoresist giving rise to the patterned structure 220. The remaining photoresist can be used as an etch barrier in the normal way to fabricate structures, such as gate apertures for field emitter arrays (FEA). In one preferred embodiment, a positive tone process is utilized. Alternatively, a negative tone process can be employed through the use of resists that cross-link or densify upon EUV exposure.

Figure 3A:
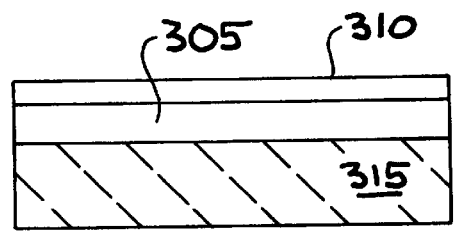
FIG. 3 is a process flow for developing a demagnified image in a bi-layer resist according to a second embodiment of the present invention.
Figure 3B:
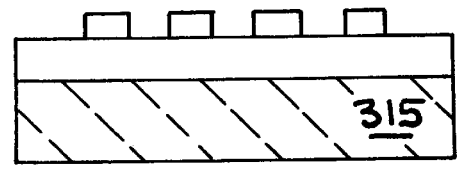
Figure 3C:
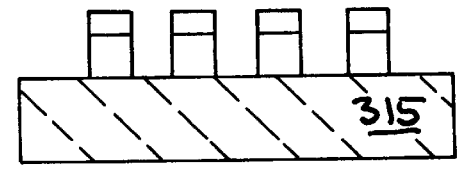

Referring now to FIG. 3, a second photoresist configuration is shown which is also useful for producing a patterned array of submicron apertures and other structures by means of EUV lithography. Here a bi-layer photoresist compatible with the teachings of the present invention is shown. The bi-layer is formed by first depositing a 0.5–1 μm thick planarizing layer 305 which is then covered with a thin etch-resistant imaging layer 310 on the surface of a silicon or other wafer 315 to be processed. The planarizing layer 305 can be an organic polymer, such as hard-baked novolac having a thickness of about 0.5 μm, or a plasma-deposited carbon film. The imaging layer 310 is a 0.1–0.2 μm thick layer formed from polymers such as polysilanes, polysiloxanes, or polygermanes (polysilanes being preferred because of their total lack of oxygen) and includes elements that impart etch resistance to the imaging layer. Preferably silicon is present as a repeating polysilane (—Si—Si—Si)$_n$ or as a polysiloxane (—Si—O—Si—O) Alternatively, boron carbides, vanadium oxides ($V_2O_5$), molybdenum oxides ($MoO_3$), or organotitanates, such as [Ti-(OCxHy)$_2$] may also be used as pure films of each or in combination.

The planarizing layer is "hard-baked" at a temperature of 160–200C. for 30–60 minutes. A polysilane, such as poly (cyclohexylmethyl-co-trimethylsilylmethyl silane) is dissolved in xylenes to a viscosity appropriate to allow a 150–250 nm thick film to be spin-cast at a rate between 2000–4000 rpm on top of the planarizing layer 305 to form the imaging layer 310. The resulting imaging layer 310 is then baked at 125C. for several minutes to drive off all solvents and to allow the layer to flow conformally.

The photoresist is then exposed to the EUV radiation image which forms the latent image in imaging layer 310. The exposed imaging layer 310 is developed using tetrahydrofuran for 1–2 minutes, which dissolves away the exposed regions but not the unexposed regions. The resulting patterned imaging layer 310 is now used as an in-situ etch mask to etch through the organic planarizing layer 305 using an oxygen plasma etch preferably at a plasma power of ~2000 W at an oxygen pressure of ~$2 \times 10^{-3}$ Torr. The resulting pattern, shown in FIG. 3c would have a total film thickness of 650–750 nm, yielding a much more robust photoresist layer for subsequent wet or dry etch fabrication of structures such as gate apertures for a FEA. An example of such a process for vanadium oxide, the $V_2O_5$ layer would be vapor deposited to a thickness of only 10–20 nm on top of the planarizing layer. The latent image is developed in nitric acid to reveal the patterned image. The pattern is then transferred to the planarizing layer 305 with a reactive ion etch. FIGS. 3a, b, and c illustrate a negative tone process which can be obtained with a polysiloxane imaging layer. A positive tone process is also possible wherein a polysilane, polygermane, vanadium oxide, or molybdenum oxide is used as the imaging layer.

EXAMPLE

As an example of the process disclosed herein, a patterned array of gates, useful for field emitter arrays, was produced using EUV lithography.

A 120 watt KrF excimer laser was used to produce 0.6 Joule pulses having 25 ns duration at a maximum repetition rate of 200 Hz, and was focused to achieve an intensity of $1-2 \times 10^{11}$ Watts per cm$^2$ on a gold target. The extreme ultraviolet radiation produced from the gold plasma, which fell within a 0.155 steradian solid angle (2.5% of the available 2 π steradians), was collected by a condenser to provide a 5 mm Kohler-illuminated spot on a mask containing nine identical square arrays, each of which contained a 10 by 10 array of circular gates. The condenser was positioned so that one focal point was located on the laser plasma source which was located 112.5 mm from the ellipsoidal surface in an extension tube on one side of the camera chamber. The resulting image of the source at focal point was magnified by 13.3 times. The Schwarzchild camera was optimized to achieve 0.1 micrometer resolution over a 0.4 mm diameter field of view. The Schwarzschild camera included a primary and secondary mirror having modest clear apertures of 14.8 mm and 82 mm, respectively. A decentered unobscured numerical aperture of 0.08 was selected by rotating an aperture plate immediately in front of the primary mirror, which resulted in a design depth of focus of +/−1.0 μm. The distance between the object and the image planes was 315 mm. The calculated modulation for 0.1 micrometer lines and spaces was approximately 0.824 for an unaberrated system illuminated with a pupil fill factor of 0.5. Alignment of the primary and secondary mirrors was performed to tolerances of +/−9 μm in separation and +/−2.5 μm in decentration. The mirror pair used for the present embodiment exhibited a wave front error of 2 nm rms within the relevant subaperture after final alignment. The wave front error exhibited only very slow variation across the subaperture and camera alignment remained stable over a period of several months.

In operation, the source image was reflected by the reflective surfaces of the reflective mask into the 4 mm entrance pupil of the Schwarzschild camera, achieving a coherence factor of approximately 0.5. Thereafter, a demagnified image was achieved by reflecting the image pattern from the primary mirror to the secondary mirror which was thereafter reflected into a target wafer.

A special "sandwich" structure silicon target wafer 130 was prepared which comprised a 0.2 $\mu$m thick molybdenum layer covering a 0.6 $\mu$m thick silicon oxide layer on top of the silicon substrate. The molybdenum layer, which was the uppermost layer in the "sandwich" structure was spin-coated with a 110 nm thick layer of ZEP resist. The resist was then pre-baked at 200° C. for 2 minutes, cooled and then exposed to the gate array EUV image using the Schwarzschild camera 125. After exposure the resist was developed in xylenes for 5 minutes and rinsed in a mixture of isopropanol and methyl isobutyl ketone.

Figure 4:
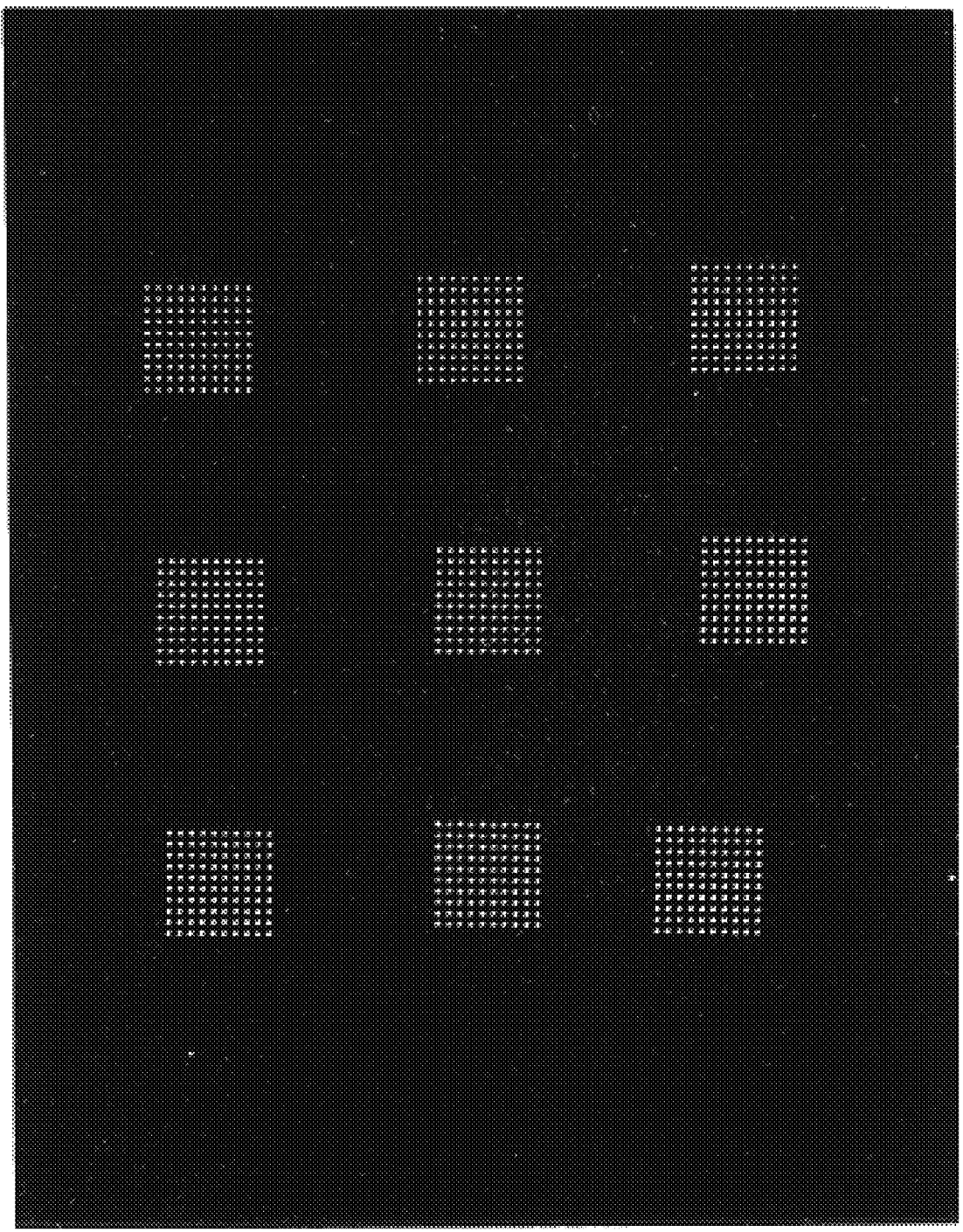
FIG. 4 shows a dark field optical micrograph of a patterning obtained using the extreme ultraviolet light system according to the preferred embodiment of the present invention.

Referring now to FIG. 4, a dark field optical micrograph of the patterning of gate apertures for field emitter arrays is shown having been obtained using the extreme ultraviolet lithography system and employing ZEP photoresist according to the above-described process. The print field measures 280 $\mu$m by 280 $\mu$m and was obtained in a single exposure with the Schwarzschild objective illuminated by a laser plasma source, as described earlier. The print field shown in FIG. 4 is a pattern of nine identical square arrays, each of which contains a 10×10 array of circular gate apertures, for a total of 900 gate apertures. The gate apertures are approximately 0.4 $\mu$m in diameter and spaced on 4 $\mu$m centers.

Figure 5:
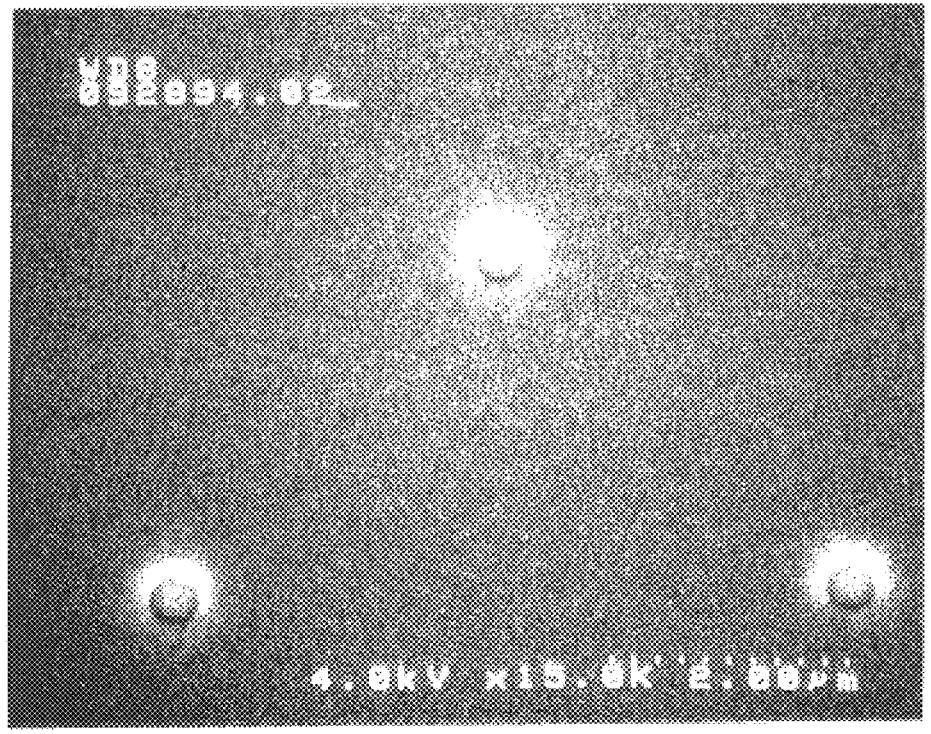
FIG. 5 is a second micrograph showing three gates of the printed field displayed in FIG. 4.
Figure 6:
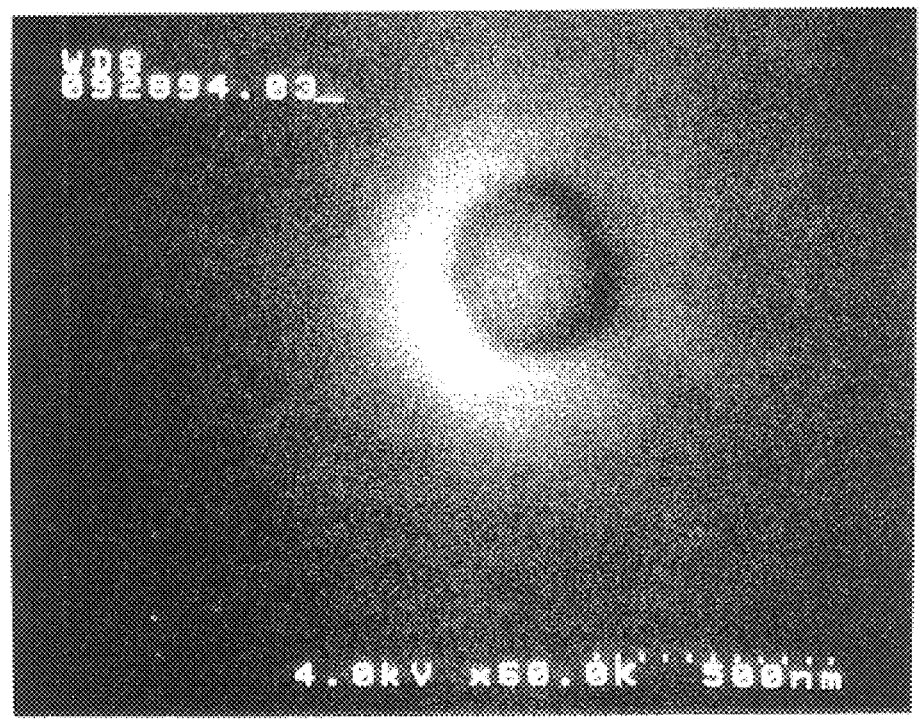
FIG. 6 is an electron micrograph at four times higher magnification, i.e. 60,000×, of the same structure of FIG. 5.

Referring now to FIG. 5, a scanning electron micrograph containing three gates of the printed field of 900 gates is shown. FIG. 5 is rotated 45° with respect to FIG. 4. FIG. 6 is an electron micrograph at four times higher magnification, i.e. 60,000×, of the same structure of FIG. 5. As shown in FIG. 6, the teachings of the present invention allow for sharp well-defined edges in the printed features which may be utilized not only in the fabrication of gates for field emitter arrays but also in other various microelectronic, microoptical and micromechanical fabrication processes.

The foregoing descriptions are illustrative of the invention and should not be construed as limiting. Various modifications may occur to those skilled in the art without departing from the scope of the invention as defined by the appended claims.

We claim:

1. A photoresist composition for extreme ultraviolet radiation lithography selected from a group consisting essentially of boron carbide Polymers, hydrochlorocarbons, and combinations thereof, said hydrochlorocarbons photoresist compositions containing about 50–80 atomic percent carbon, and about 15–30 atomic percent chlorine, said boron carbide polymer photoresists containing about 20–50 atomic percent boron.

* * * * *